United States Patent
Nakamoto

(10) Patent No.: US 7,638,824 B2
(45) Date of Patent: Dec. 29, 2009

(54) FIELD EFFECT TRANSISTOR HAVING A CRANK-SHAPED MULTIGATE STRUCTURE

(75) Inventor: Takahiro Nakamoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 80 days.

(21) Appl. No.: 11/832,819

(22) Filed: Aug. 2, 2007

(65) Prior Publication Data

US 2008/0173907 A1    Jul. 24, 2008

(30) Foreign Application Priority Data

Jan. 22, 2007   (JP) .............................. 2007-011945

(51) Int. Cl.
*H01L 29/768* (2006.01)
(52) U.S. Cl. ................ 257/249; 257/E29.015
(58) Field of Classification Search ................ 257/212, 257/255, 615, 249, 192, 250
See application file for complete search history.

(56) References Cited

U.S. PATENT DOCUMENTS 4,313,126 A    1/1982   Krumm et al.
2005/0285144 A1*  12/2005  O'Keefe et al. .............. 257/194
2006/0060895 A1*   3/2006  Hikita et al. ................. 257/280
2006/0118951 A1    6/2006  Ogawa et al.
2008/0061324 A1*   3/2008  Yoshida et al. .............. 257/255
2008/0073752 A1*   3/2008  Asai et al. ................... 257/615
2008/0173906 A1*   7/2008  Zhu et al. .................... 257/255

FOREIGN PATENT DOCUMENTS

JP    2006-165224    6/2006

* cited by examiner

*Primary Examiner*—Nathan W Ha
(74) *Attorney, Agent, or Firm*—Leydig, Voit & Mayer, Ltd.

(57) ABSTRACT

A field effect transistor includes a pair of ohmic electrodes and an n-type GaAs layer between the pair of ohmic electrodes and having recesses. Crank-shaped gate fingers are located within the recesses of the n-type GaAs layer between the pair of ohmic electrodes, and each crank-shaped gate finger includes perpendicular-extending portions and parallel-extending portions relative to the $[0, \bar{1}, \bar{1}]$ crystal orientation of the n-type GaAs layer. The portion of the n-type GaAs layer between the gate fingers continuously extends from input ends of the gate electrodes to terminal ends of the gate electrode. A non-active region is located around each perpendicular-extending portion of the gate fingers.

7 Claims, 5 Drawing Sheets

FIELD EFFECT TRANSISTOR HAVING A CRANK-SHAPED MULTIGATE STRUCTURE

FIELD OF THE INVENTION

The present invention relates to a field effect transistor, and more particularly to a field effect transistor having a crank-shaped multigate structure.

BACKGROUND ART

In communication devices, switching elements have been used to switch high frequency signals. Reducing the size of these devices and enhancing their performance therefore requires a high power switching element capable of low voltage operation. A plurality of field effect transistors (hereinafter referred to as "FETs") may be coupled in series to form such a switching element. However, it is difficult to reduce its size, since the use of a plurality of FETs results in an increased FET area.

To overcome this problem, switching elements having a multigate structure have been proposed. A multigate structure is a structure in which a plurality of gate electrodes is disposed between a pair of ohmic electrodes. Note that it is common to use the double-gate structure, in which two gate electrodes are disposed in parallel relationship. Further, there are several shapes of gate electrodes that can be used in a multigate structure. Crank-shaped gate electrodes are particularly advantageous in terms of reducing the FET area.

The multigate structure is advantageous in that it allows a reduction in the size of the switching elements. However, the potential of the region between the gates varies with position, since it is in a floating state. Therefore, it is not possible to completely turn off conduction between the ohmic electrodes when the FET is put in the off state.

One method for solving this problem has been to couple the $n^+$ region between the gates to the ohmic electrodes by use of potential stabilizing resistances (see for example, JP-A-2006-165224, Laid open patent publication). In this structure, the above $n^+$ region between the gates is held at the same (stabilized) potential as one of the ohmic electrodes.

However, the use of crank-shaped gate electrodes has the following problem. In an FET having a conventional crank-shaped multigate structure, all portions of the crank-shaped gate electrodes function as part of the gates of the FET and hence contribute to its operation. More specifically, for example, when the crank-shaped gate electrodes are disposed on an n-type GaAs layer formed on an insulative semiconductor substrate, both the perpendicularly extending portions and the parallelly extending portions of each gate electrode relative to the [0, $\bar{1}$, $\bar{1}$] crystal orientation of the n-type GaAs layer function as part of the gates of the FET and hence contribute to its operation. Therefore, these perpendicularly and parallelly extending portions must meet the required gate characteristics of the FIT. Specifically, they must have a high dielectric strength voltage (e.g., 10 V or higher).

Incidentally, FETs have employed a recessed structure to achieve enhanced dielectric strength and improved high frequency characteristics. Specifically, in this recessed structure, the n-type active layer is thinner under and around the gate electrodes than under the ohmic electrodes. Such a structure allows a reduction in the source resistance and in the electric field concentration in the drain alloy region.

The recessed structure is formed by wet etching. For example, a silicon oxide film is formed on an n-type semiconductor layer, i.e. an n-type GaAs layer, and then openings are formed through the silicon oxide film to the n-type GaAs layer by photolithography. The exposed n-type GaAs layer is then wet-etched using the silicon oxide film as a mask to form recesses in the n-type GaAs layer. Then, after depositing a gate electrode material, gate electrodes are formed within the recesses by lift-off.

Since the above wet etching is isotropic, the n-type GaAs layer is etched not only in its thickness direction but also in directions perpendicular thereto. However, the etching rate differs in different directions, that is, there is a difference between the amounts of etching in a perpendicular direction and in a parallel direction relative to a crystal orientation of the n-type GaAs layer. It should be noted that which direction provides a larger amount of etching depends on the combination of the crystal orientation of the n-type semiconductor layer and the etchant used.

The difference between the amounts of etching in the perpendicular and parallel directions (relative to the above crystal orientation of the n-type semiconductor layer) results in a difference in width between the portions of the recesses extending in these directions. It should be noted that narrower portions of the recesses have lower dielectric strength voltages. As a result, it is difficult to form the perpendicularly and parallelly extending portions of the recesses (relative to the above crystal orientation of the n-type semiconductor layer) such that both have a sufficient dielectric strength.

Further, in the case of crank-shaped gate electrodes, the electric field concentration at their bent portions reduces the dielectric strength of the gate electrodes even if there is not a significant difference in width between the perpendicularly extending portions and the parallelly extending portions of the recesses in which these gate electrodes are disposed.

The present invention has been devised in view of the above problems. It is, therefore, an object of the present invention to provide an FET having a crank-shaped multigate structure adapted to have improved operating characteristics even if the perpendicularly and parallelly extending portions of the recesses of the n-type semiconductor layer (relative to a crystal orientation of the n-type semiconductor layer) have different widths.

Another object of the present invention is to provide an FET having a crank-shaped multigate structure adapted to have sufficient dielectric strength. Other objects and advantages of the present invention will become apparent from the following description.

SUMMARY OF THE INVENTION

According to a first aspect of the present invention, a field effect transistor having a crank-shaped multigate structure comprises a pair of ohmic electrodes and a semiconductor layer formed between the pair of ohmic electrodes and having a recess that has a perpendicularly extending portion and a parallelly extending portion relative to a predetermined crystal orientation of the semiconductor layer. A plurality of crank-shaped gate electrodes are formed within the recess of the semiconductor layer and each crank-shaped gate electrode has a perpendicularly extending portion and a parallelly extending portion relative to the predetermined crystal orientation of the semiconductor layer The perpendicularly extending portion is disposed within the perpendicularly extending portion of the recess, and the parallelly extending portion is disposed within the parallelly extending portion of the recess. The semiconductor layer includes a non-active region formed around either the perpendicularly extending portion or the parallelly extending portion of the plurality of gate electrodes relative to the predetermined crystal orientation of the semiconductor layer. The semiconductor layer further includes an active region in a principal surface thereof and between the plurality of gate electrodes, and the active region continuously extends from the input ends of the plurality of gate electrodes to the terminal ends thereof. A potential clamp electrode is provided on a surface of the continuously extending active region.

According to a second aspect of the present invention, a field effect transistor has a crank-shaped multigate structure, and comprises a pair of ohmic electrodes and a semiconductor layer formed between the pair of ohmic electrodes. The semiconductor layer includes an active region and a non-active region. A plurality of crank-shaped gate electrodes are formed on the semiconductor layer and has a bent portion or portions. The active region of the semiconductor layer is disposed between the plurality of gate electrodes so as to continuously extend from the input ends of the plurality of gate electrodes to the terminal ends thereof. The non-active region of the semiconductor layer is formed around the bent portion of the plurality of gate electrodes.

According to a third aspect of the present invention, a field effect transistor having a crank-shaped multigate structure comprises a pair of ohmic electrodes and a semiconductor layer formed between the pair of ohmic electrodes, and the semiconductor layer includes an active region. A plurality of crank-shaped gate electrodes is formed on the semiconductor layer and has a bent portion. The active region of the semiconductor layer is disposed between the plurality of gate electrodes so as to continuously extend from the input ends of the plurality of gate electrodes to the terminal ends thereof. The bent portion of the plurality of gate electrodes has an arc shape with a predetermined radius of curvature.

ADVANTAGEOUS EFFECTS OF THE INVENTION

Thus, according to the first aspect of the present invention, when the perpendicularly extending portion of the recess of the semiconductor layer relative to the predetermined crystal orientation of the semiconductor layer is smaller in width than the parallelly extending portion of the recess, a non-active region is formed around the perpendicularly extending portion of the gate electrodes disposed in the perpendicularly extending portion of the recess. On the other hand, when the parallelly extending portion of the recess of the semiconductor layer is smaller in width than the perpendicularly extending portion of the recess, a non-active region is formed around the parallelly extending portion of the gate electrodes disposed in the parallelly extending portion of the recess. This arrangement prevents the operation of the FET from being significantly affected by the fact that the perpendicularly extending portion and the parallelly extending portion of the recess have different widths. Further, since the active region of the semiconductor layer between the gate electrodes continuously extends from the input ends of the gate electrodes to the terminal ends thereof, it is possible to prevent the potential of the semiconductor layer (or active region) from varying with position between the gate electrodes by applying a bias to the semiconductor layer.

Further, according to the second aspect of the present invention, a non-active region is formed around a bent portion of the gate electrodes, which reduces the electric field concentration at that portion and thereby prevents a reduction in the dielectric strength of the field effect transistor. Further, since the active region of the semiconductor layer between the gate electrodes continuously extends from the input ends of the gate electrodes to the terminal ends thereof, it is possible to prevent the potential of the semiconductor layer (or active region) from varying with position between the gate electrodes by applying a bias to the semiconductor layer.

Further, according to the third aspect of the present invention, a bent portion of the gate electrodes has an arc shape with a predetermined radius of curvature, which reduces the electric field concentration at that portion and thereby prevents a reduction in the dielectric strength of the field effect transistor. Further, since the active region of the semiconductor layer between the gate electrodes continuously extends from the input ends of the gate electrodes to the terminal ends thereof, it is possible to prevent the potential of the semiconductor layer (or active region) from varying with position between the gate electrodes by applying a bias to the semiconductor layer.

Further, still other features and advantages of the present invention will become apparent from the following descriptions.

BEST MODES FOR CARRYING OUT THE INVENTION

First Embodiment

Figure 1:
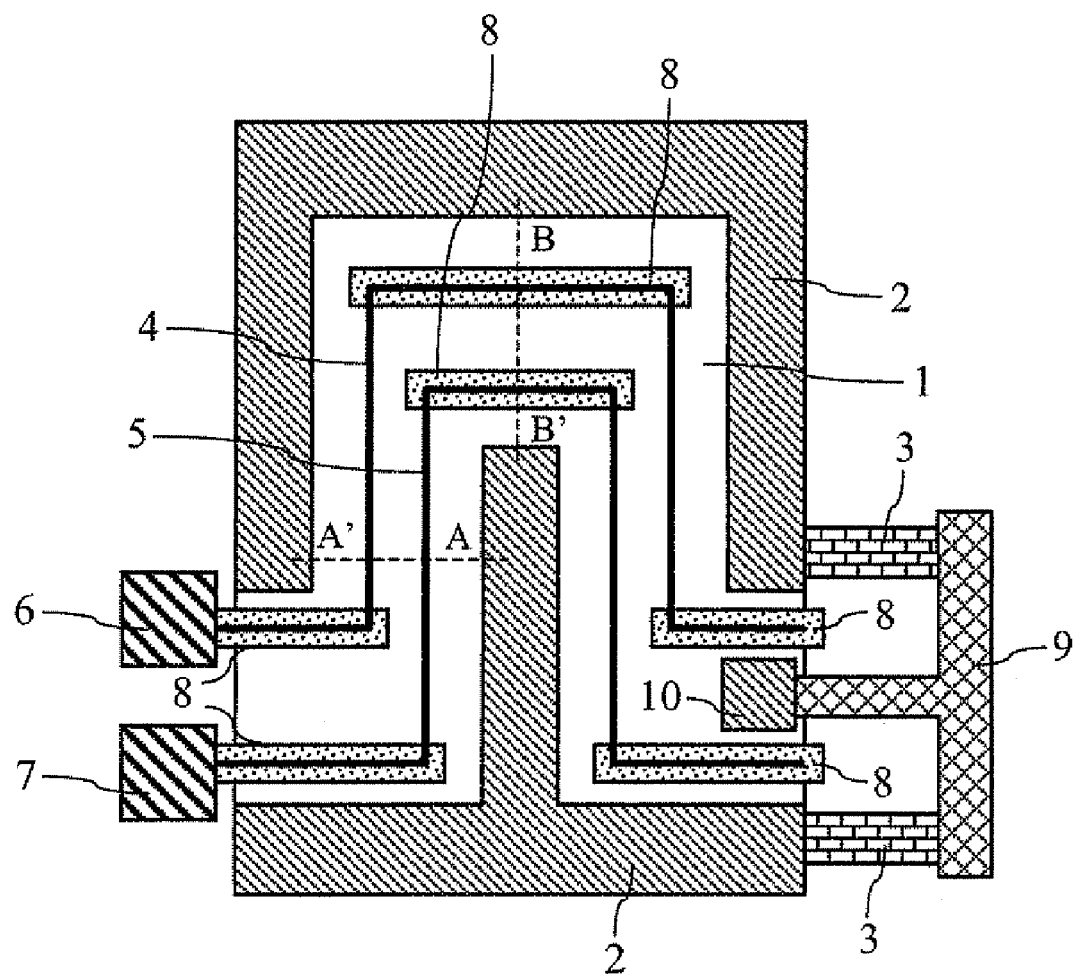
FIG. 1 is a plan view of a field effect transistor according to a first embodiment of the present invention.

FIG. 1 is a plan view of a field effect transistor according to a first embodiment of the present invention. It should be noted that although the field effect transistor of the present embodiment has a crank-shaped double gate structure, the present invention is not limited to this particular type of field effect transistor. The present invention can be applied to any field effect transistor having a crank-shaped multigate structure.

Referring to FIG. 1, a pair of ohmic electrodes 2 is disposed on an n-type GaAs layer 1. One of the ohmic electrodes 2 is a source electrode, and the other ohmic electrode is a drain electrode. The n-type impurity in the n-type GaAs layer 1 may be Si (silicon).

Figure 2A:
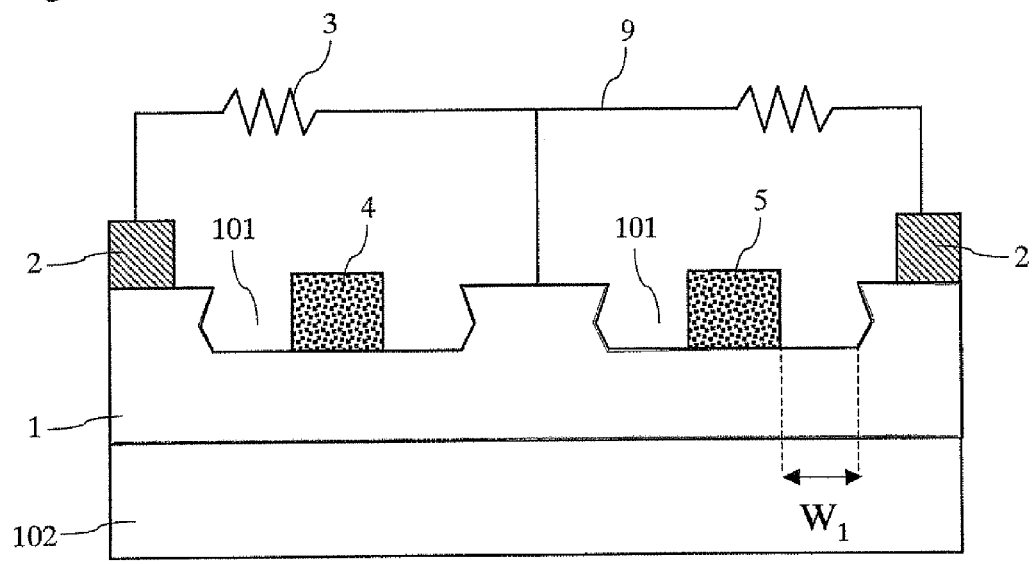
FIG. 2A is a cross-sectional view taken along line A-A' of FIG. 1, showing cross sections of parallelly extending portions of the gate fingers 4 and 5 relative to the [0, $\overline{1}$, $\overline{1}$] crystal orientation of the n-type GaAs layer 1.
Figure 2B:
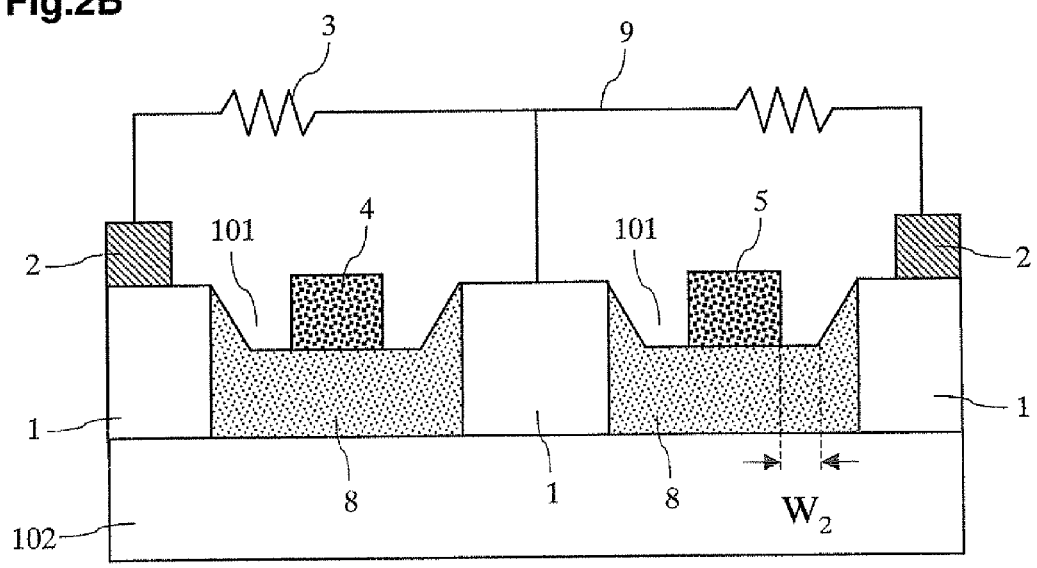
FIG. 2B is a cross-sectional view taken along line B-B' of FIG. 1, showing cross sections of perpendicularly extending portions of the gate fingers 4 and 5 relative to the above crystal orientation.

Two recesses are formed in the surface of the n-type GaAs layer 1 and between the ohmic electrodes 2 (see FIGS. 2A and 2B). Further, gate fingers 4 and 5 are disposed within their respective recesses. That is, this field effect transistor has a double gate structure in which two parallel gate electrodes, or gate fingers 4 and 5 are sandwiched between a pair of ohmic electrodes 2. Further, the gate fingers 4 and 5 have a crank shape, as shown in FIG. 1.

The above recesses are formed, for example, in the following manner. First, a silicon oxide film (not shown) is formed on the n-type GaAs layer 1, and then openings are formed through the silicon oxide film to the n-type GaAs layer 1 by photolithography. The exposed n-type GaAs layer 1 is then wet etched using the silicon oxide film as a mask to form the recesses in the n-type GaAs layer 1. Then, a gate electrode material is deposited, and by lift-off, gate fingers 4 and 5 are formed within the recesses.

Referring still to FIG. 1, a potential clamp electrode 10 is disposed on the n-type GaAs layer 1 and between the gate fingers 4 and 5 to clamp or fix the potential of the n-type GaAs layer 1. The potential clamp electrode 10 is connected to the ohmic electrodes 2 through metal wiring 9 and metal resistances 3. The potential clamp electrode 10 is formed of an ohmic metal. Further, the metal resistances 3 have a high resistance of a few to a few tens of kilohms and are made of WSiN, etc. According to the present invention, instead of providing the potential clamp electrode 10, an impurity diffusion layer functioning as a resistive element may be formed to couple the active region (i.e., the n-type GaAs layer 1) to the power supply portion to produce the same effect. This resistive element corresponds to the metal resistances 3.

Gate input terminals 6 and 7 are disposed outside the ohmic electrodes 2 and the n-type GaAs layer 1. The gate fingers 4 and 5 are coupled to the gate input terminals 6 and 7, respectively. Gate signals are input to the gate fingers 4 and 5 through the gate input terminals 6 and 7, respectively.

The present embodiment assumes that the perpendicularly extending portions of the recesses relative to the [0, $\bar{1}$, $\bar{1}$] crystal orientation of the n-type GaAs layer 1 are smaller in width than the parallelly extending portions of the recesses. It should be noted that in FIG. 1, the lateral direction corresponds to a perpendicular direction relative to the above crystal orientation of the n-type GaAs layer 1, and the longitudinal direction corresponds to a parallel direction.

FIG. 2A is a cross-sectional view taken along line A-A' of FIG. 1, showing cross sections of parallelly extending portions of the gate fingers 4 and 5 relative to the [0, $\bar{1}$, $\bar{1}$] crystal orientation of the n-type GaAs layer 1. FIG. 2B, on the other hand, is a cross-sectional view taken along line B-B' of FIG. 1, showing cross sections of perpendicularly extending portions of the gate fingers 4 and 5 relative to the above crystal orientation. As shown in these figures, the n-type GaAs layer 1 is formed on a semi-insulating substrate 102, and recesses 101 are formed in the surface of the n-type GaAs layer 1. The portions of the recesses 101 extending perpendicular to the [0, $\bar{1}$, $\bar{1}$] crystal orientation of the n-type GaAs layer 1 (hereinafter referred to as the laterally extending portions of the recess 101) are smaller in width than the portions of the recesses 101 extending parallel to that crystal orientation (hereinafter referred to as the longitudinally extending portions of the recess 101). That is, the distance $W_1$ between the gate finger 5 (or the gate finger 4) and the bottom of the facing wall of each longitudinally extending portion of the recesses 101 is larger than the distance $W_2$ between the gate finger 5 (or the gate finger 4) and the bottom of the facing wall of each laterally extending portion of the recesses 101 (see FIGS. 2A and 2B). The distances $W_1$ and $W_2$ may be referred to as the widths of the longitudinally extending portions and the laterally extending portions, respectively, of the recesses 101, since the crank-shaped gate fingers 4 and 5 have the same constant width (or gate length) regardless of the direction in which they extend (relative to the above crystal orientation of the n-type GaAs layer 1).

One characteristic of the field effect transistor of the present embodiment is that a non-active region is provided around each laterally extending portion (or each perpendicularly extending portion relative to the [0, $\bar{1}$, $\bar{1}$] crystal orientation of the n-type GaAs layer 1) of each gate finer. This non-active region is formed by implanting an insulating material in the n-type GaAs layer 1. Specifically, referring to FIG. 1, non-active regions 8 are formed in the n-type GaAs layer 1 such that each non-active region 8 is disposed around a laterally extending portion of the gate fingers 4 and 5.

According to the present embodiment, the thickness of the n-type GaAs layer 1 may be, for example, between a few hundreds of nanometers to one micron. Helium ions or hydrogen ions are implanted in predetermined portions of the n-type GaAs layer 1 to a depth of a few hundreds of nanometers to a few microns. This ion implantation transforms these predetermined portions into the non-active regions 8. The non-active regions 8 extend from the top surface of the n-type GaAs layer 1 to the bottom surface of the n-type GaAs layer 1, i.e., to the surface of the substrate 102.

The laterally extending portions of the gate fingers 4 and 5 cannot function as part of the gates of the FET and hence cannot contribute to its operation since they are surrounded by the non-active regions 8. On the other hand, since the longitudinally extending portions of the gate fingers 4 and 5 are surrounded by the active region, they can function as part of the gates of the FET and hence contribute to its operation. That is, in this crank-shaped multigate structure, only the longitudinally extending portions of the gate fingers 4 and 5 are allowed to function and hence contribute to the operation of the FET. This means that the operation of the FET is not significantly affected by the fact that the laterally extending portions of the recesses 101 are smaller in width than the longitudinally extending portions of the recesses 101.

Another characteristic of the field effect transistor of the present embodiment is that the active region of the n-type GaAs layer 1 between the gate fingers 4 and 5 continuously extends from the input ends of the gate electrodes (or gate fingers 4 and 5) to the terminal ends thereof, that is, the active region is not divided by the non-active regions 8. Therefore, it is possible to prevent the potential of the n-type GaAs layer 1 (or the active region) from varying with position between the gate electrodes (or gate fingers 4 and 5) by applying a bias to the potential clamp electrode 10 formed on the n-type GaAs layer 1.

According to the present embodiment as described above, since each laterally extending portion of the gate electrodes (or gate fingers) is surrounded by a non-active region 8, only the longitudinally extending portions of the gate electrodes function as part of the gates of the FET and hence contribute to its operation. Therefore, the operation of the FET is not significantly affected by the fact that the laterally extending portions of the recesses 101 are smaller in width than the longitudinally extending portions of the recesses. Further, since the active region of the semiconductor layer (i.e., n-type GaAs layer) between the gate electrodes (or gate fingers) continuously extends from the input ends of the gate electrodes to the terminal ends thereof, it is possible to prevent the potential of the semiconductor layer (or the active region) from varying with position between the gate electrodes by applying a bias to the semiconductor layer.

Although in the field effect transistor of the present embodiment a non-active region is formed around each laterally extending portion of the gate electrodes, the present invention is not limited to this particular arrangement. It should be noted that the longitudinally extending portions of the recesses 101 may be formed to be smaller in width than the laterally extending portions of the recesses depending on the combination of the crystal orientation of the semiconductor layer and the etchant used. In such a case, a non-active region may be formed around each longitudinally extending portion of the gate electrodes to allow only the laterally extending portions of the gate electrodes to function and hence contribute to the operation of the FET.

Further, according to the present embodiment, the gate length of the laterally extending portions of the gate electrodes may be compared with that of the longitudinally extending portions of the gate electrodes. If the laterally extending portions of the gate electrodes have a shorter gate length, then the etchant may be selected such that the laterally extending portions of the recesses 101 are formed to be smaller in width than the longitudinally extending portions of the recesses, and vice versa. Then, non-active regions may be formed around whichever portions of the gate electrodes have a shorter gate length. This arrangement allows the portions of the gate electrodes having a longer gate length to function and hence contribute to the operation of the FET. (That is, an increased gate area is used for the operation of the FET.)

Further, although the field effect transistor of the present embodiment employs an n-type GaAs layer, other compound semiconductor layers may be used instead, such as n-type GaN layers. Also in such cases, a non-active region may be formed around each perpendicularly extending portion or parallelly extending portion of the gate electrodes relative to a predetermined crystal orientation of the semiconductor layer to produce the beneficial effects as described above.

Second Embodiment

Figure 3:
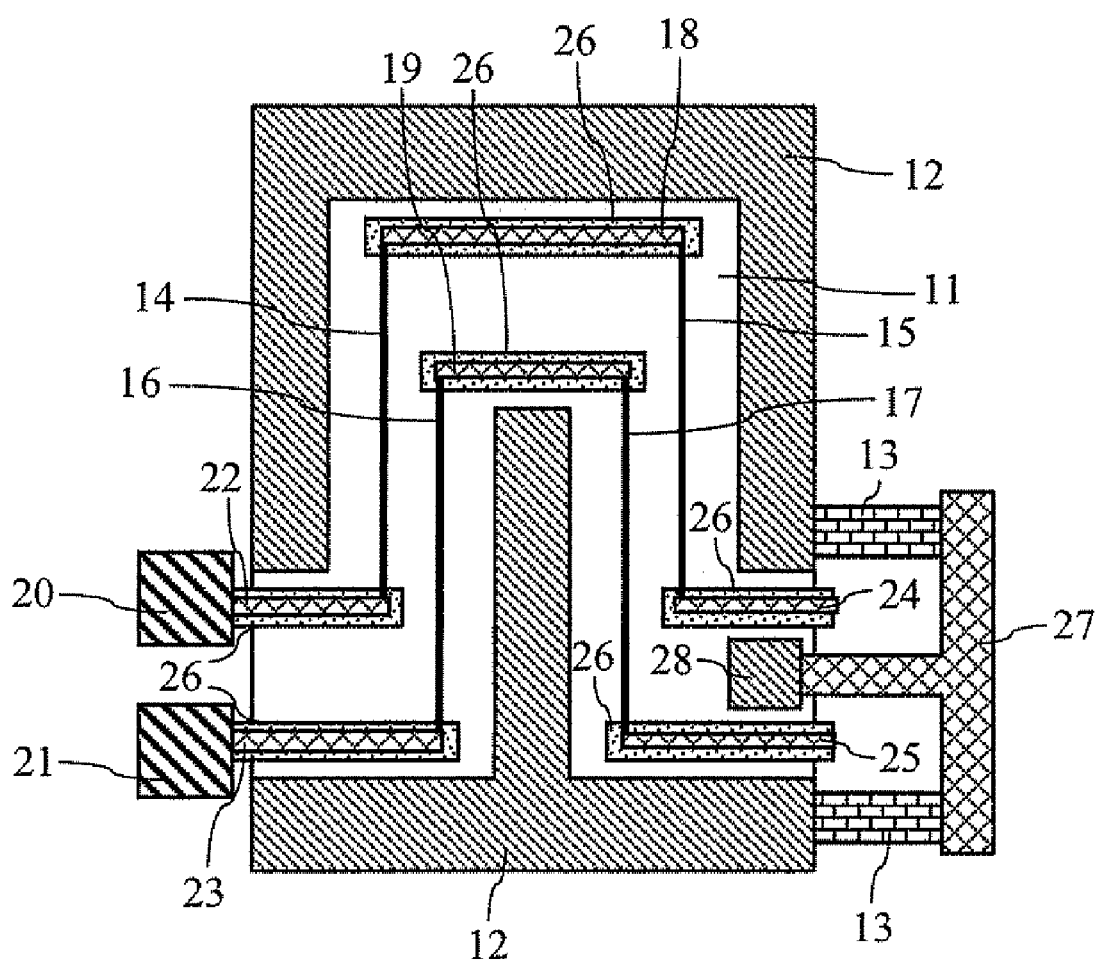
FIG. 3 is a plan view of a field effect transistor according to a second embodiment of the present invention.

FIG. 3 is a plan view of a field effect transistor according to a second embodiment of the present invention. Although the field effect transistor of the present embodiment has a crank-shaped double gate structure, the present invention is not limited to this particular type of field effect transistor. The present invention can be applied to any field effect transistor having a crank-shaped multigate structure.

Referring to FIG. 3, a pair of ohmic electrodes 12 is disposed on an n-type GaAs layer 11. One of the ohmic electrodes 12 is a source electrode, and the other ohmic electrode is a drain electrode. The n-type impurity in the n-type GaAs layer 11 may be Si (silicon).

Two recesses are formed in the surface of the n-type GaAs layer 11 and between the ohmic electrodes 12 (see FIGS. 2A and 2B). These recesses can be formed by wet etching in the same manner as described in connection with the first embodiment. The present embodiment assumes that the perpendicularly extending portions of the recesses relative to the [0, $\bar{1}$, $\bar{1}$] crystal orientation of the n-type GaAs layer 11 are smaller in width than the parallelly extending portions of the recesses, as shown in FIGS. 2A and 2B described in connection with the first embodiment. It should be noted that in FIG. 3 the lateral direction corresponds to a perpendicular direction relative to the above crystal orientation of the n-type GaAs layer 11, and the longitudinal direction corresponds to a parallel direction.

Referring to FIG. 3, gate fingers 14, 15, 16, and 17 are disposed within respective longitudinally extending portions (or parallelly extending portions relative to the above crystal orientation of the n-type GaAs layer 11) of the recesses. The gate fingers 14 and 15 are coupled together by a metal wire 18 disposed within a laterally extending portion (or perpendicularly extending portion relative to the above crystal orientation) of one recess. The gate fingers 16 and 17, on the other hand, are coupled together by a metal wire 19 disposed within a laterally extending portion of the other recess.

Gate input terminals 20 and 21 are disposed outside the ohmic electrodes 12 and the n-type GaAs layer 11. The gate input terminals 20 and 21 are connected to the gate fingers 14 and 16 by metal wires 22 and 23, respectively. A gate signal is input to the gate finger 14 through the gate input terminal 20 and the metal wire 22 and delivered through the metal wire 18 to the gate finger 15 and then to a metal wire 24. Likewise, another gate signal is input to the gate finger 16 through the gate input terminal 21 and the metal wire 23 and delivered through the metal wire 19 to the gate finger 17 and then to a metal wire 25.

Thus, each gate electrode of the present embodiment includes longitudinally extending gate fingers and laterally extending metal wires. Further, these two parallel gate electrodes are disposed between a pair of ohmic electrodes 12. That is, like the field effect transistor of the first embodiment, the field effect transistor of the present embodiment has a double gate structure. Further, the gate electrodes have a crank shape, since they are made up of longitudinally extending gate fingers and laterally extending metal wires, as shown in FIG. 3.

The metal wires 18, 19, 22, 23, 24, and 25 and the gate fingers 14, 15, 16, and 17 may be formed of different materials if these metal wires and gate fingers can be maintained at the same potential. For example, the metal wires 18, 19, 22, 23, 24, and 25 may be made up of a layer stack of Ti (titanium) and Au (gold). Further, the gate fingers 14, 15, 16, and 17 may be made up of a layer stack of Ti and Al (aluminum) or a layer stack of Ti, Pt (platinum), and Au.

According to the present embodiment, the metal wires 18, 19, 22, 23, 24, and 25 are preferably formed by a different process than the gate fingers 14, 15, 16, and 17. For example, first a material for forming gate fingers is deposited within the recesses and then the gate fingers are formed therein by lift-off. Then, the metal wires are formed within the laterally extending portions of the recesses. This method allows the gate electrodes to have an accurate pattern.

On the other hand, forming the gate electrodes (having a crank shape) in a single process step requires forming a fine crank-shaped pattern in a small area by wet etching. However, such wet etching may result in pattern defects since the etchant may not be able to fully cover the small target area. The gate electrode forming method of the present embodiment as described above does not suffer such a problem, since gate fingers are only formed within the longitudinally extending portions of the recesses by lift-off, and metal wires are formed within the laterally extending portions of the recesses after forming the gate fingers. As a result, it is possible to form gate electrodes having an accurate pattern.

According to the present embodiment, a non-active region is formed around each laterally extending portion of the gate electrodes, as in the first embodiment. Specifically, according to the present embodiment, the metal wires 18, 19, 22, 23, 24, and 25 are each surrounded by a non-active region 26 formed in the n-type GaAs layer 11, as shown in FIG. 3. These non-active regions 26 may be formed by implanting helium ions or hydrogen ions in predetermined portions of the n-type GaAs layer 11.

The laterally extending portions of the gate electrodes cannot function as part of the gates of the FET and hence cannot contribute to its operation, since they are each surrounded by a non-active region. Therefore, these laterally extending portions of the gate electrodes need not be gate fingers and may be any suitable electrical conductors. According to the present embodiment, they are metal wires, as described above.

On the other hand, the gate fingers (or the longitudinally extending portions of the gate electrodes) are surrounded by the active region and therefore can function as part of the gates of the FET and hence contribute to its operation. That is, in this crank-shaped multigate structure, only the longitudinally extending portions of the gate electrodes are allowed to function and hence contribute to the operation of the FET.

This means that the operation of the FET is not significantly affected by the fact that the laterally extending portions of the recesses are smaller in width than the longitudinally extending portions of the recesses.

Referring to FIG. 3, the active region of the n-type GaAs layer 11 between the gate fingers 14 and 16 and between the gate fingers 15 and 17 continuously extends from the input ends of the gate electrodes to the terminal ends thereof, that is, the active region is not divided by the non-active regions 26. Therefore, an electrode pad may be provided on the n-type GaAs layer 11 and between the gate fingers 14 and 16 (or between the gate fingers 15 and 17), and a bias may be applied to the electrode pad to prevent the potential of the n-type GaAs layer 11 (or the active region) from varying with position between the gate electrodes.

In FIG. 3, a potential clamp electrode 28 is disposed on the n-type GaAs layer 11 and between the gate fingers 15 and 17 (or between the metal wires 24 and 25) to clamp or fix the potential of the n-type GaAs layer 11. The potential clamp electrode 28 is formed of an ohmic metal and connected to the ohmic electrodes 12 through metal wiring 27 and metal resistances 13. Further, the metal resistances 13 have a high resistance of a few to a few tens of kilohms and are made of WSiN; etc.

Although in the field effect transistor of the present embodiment a non-active region is formed around each laterally extending portion of the gate electrodes, the present invention is not limited to this particular arrangement. It should be noted that the longitudinally extending portions of the recesses may be formed to be smaller in width than the laterally extending portions of the recesses depending on the combination of the crystal orientation of the semiconductor layer and the etchant used. In such cases, a non-active region may be formed around each longitudinally extending portion of the gate electrodes to allow only the laterally extending portions of the gate electrodes to function and hence contribute to the operation of the FET.

Further, according to the present embodiment, the gate length of the laterally extending portions of the gate electrodes may be compared with that of the longitudinally extending portions of the gate electrodes. If the laterally extending portions of the gate electrodes have a shorter gate length, then the etchant may be selected such that the laterally extending portions of the recesses are formed to be smaller in width than the longitudinally extending portions, and vice versa. Then, non-active regions may be formed around whichever portions of the gate electrodes have a shorter gate length. This arrangement allows the portions of the gate electrodes having a longer gate length to function and hence contribute to the operation of the FET. (That is, an increased gate area is used for the operation of the FET.)

According to the present embodiment as described above, either each laterally extending portion or each longitudinally extending portion of the gate electrodes is surrounded by a non-active region to allow only the other portions of the gate electrodes to function as part of the gates of the FET and hence contribute to its operation. This arrangement allows the operation of the FET not to be significantly affected by the fact that the laterally extending portions and the longitudinally extending portions of the recesses have different widths. Further, since the active region of the semiconductor layer (or n-type GaAs layer) between the gate electrodes continuously extends from the input ends of the gate electrodes to the terminal ends thereof, it is possible to prevent the potential of the semiconductor layer (or active region) from varying with position between the gate electrodes by applying a bias to the semiconductor layer. Further, the gate electrodes can be formed to have an accurate crank shape, since they are made up of gate fingers and metal wires which are formed by different process steps.

Further, although the field effect transistor of the present embodiment employs an n-type GaAs layer, other compound semiconductor layers may be used instead, such as n-type GaN layers. Also in such cases, a non-active region may be formed around each metal wire of the gate electrodes (which extends perpendicular or parallel to a predetermined crystal orientation of the semiconductor layer) to produce the beneficial effects as described above.

Third Embodiment

Figure 4:
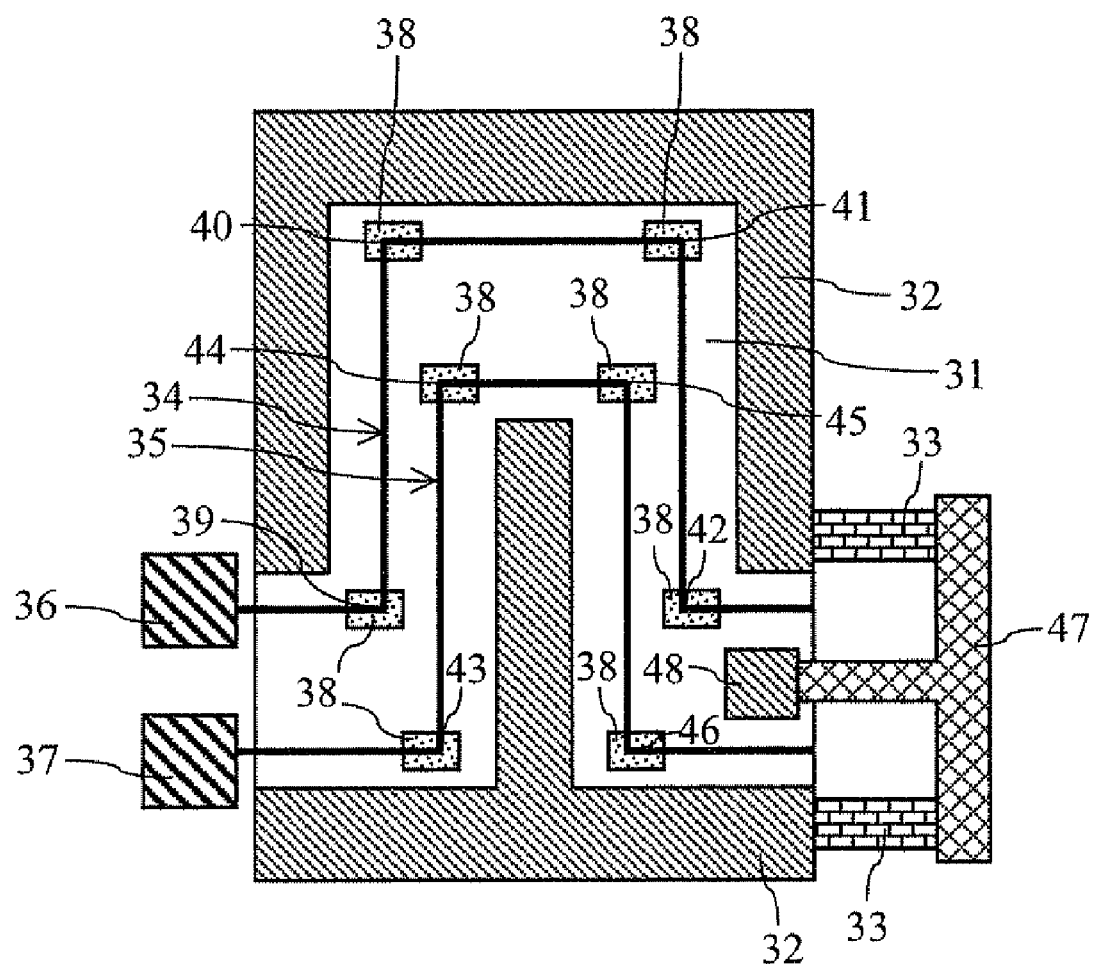
FIG. 4 is a plan view of a field effect transistor according to a third embodiment of the present invention.

FIG. 4 is a plan view of a field effect transistor according to a third embodiment of the present invention. Although the field effect transistor of the present embodiment has a crank-shaped double gate structure, the present invention is not limited to this particular type of field effect transistor. The present invention can be applied to any field effect transistor having a crank-shaped multigate structure.

Referring to FIG. 4, a pair of ohmic electrodes 32 is disposed on an n-type GaAs layer 31. One of the ohmic electrodes 32 is a source electrode, and the other ohmic electrode is a drain electrode. The n-type impurity in the n-type GaAs layer 31 may be Si (silicon).

Two recesses are formed in the surface of the n-type GaAs layer 31 and between the two ohmic electrodes 32 (see FIGS. 2A and 2B). Further, gate fingers 34 and 35 are disposed within their respective recesses. That is, this field effect transistor has a double gate structure in which two parallel gate electrodes are sandwiched between a pair of ohmic electrodes 32. Further, the gate fingers 34 and 35 have a crank shape, as shown in FIG. 4.

The recesses can be formed by wet etching in the same manner as described in connection with the first embodiment. The present embodiment assumes that the perpendicularly extending portions and the parallelly extending portions of the recesses relative to the [0, $\bar{1}$, $\bar{1}$] crystal orientation of the n-type GaAs layer 31 have substantially the same width (that is, in FIGS. 2A and 2B, $W_1$-$W_2$). It should be noted that in FIG. 4 the lateral direction corresponds to a perpendicular direction relative to the above crystal orientation of the n-type GaAs layer 31, and the longitudinal direction corresponds to a parallel direction.

Gate input terminals 36 and 37 are disposed outside the ohmic electrodes 32 and the n-type GaAs layer 31. The gate fingers 34 and 35 are connected to the gate input terminals 36 and 37, respectively. Gate signals are input to the gate fingers 34 and 35 through the gate input terminals 36 and 37, respectively.

The field effect transistor of the present embodiment is characterized in that a non-active region is provided around each bent portion of the gate electrodes. This non-active region is formed by implanting an insulating material into the n-type GaAs layer 31. Specifically, referring to FIG. 4, non-active regions 38 are formed in the n-type GaAs layer 31 such that each non-active region 38 is disposed around a respective one of bent portions 39 to 42 of the gate finger 34 and bent portions 43 to 46 of the gate finger 35. It should be noted that the non-active regions 38 are formed by implanting helium ions or hydrogen ions into the GaAs layer.

According to the present embodiment, the gate fingers, except for their bent portions, are surrounded by the active region. Therefore, both the laterally extending portions and longitudinally extending portions (or perpendicularly extending portions and parallelly extending portions relative to the above crystal orientation of the n-type GaAs layer 31) of the gate fingers function as part of the gates of the FET and hence contribute to its operation. However, their bent portions do not function as part of the gates, since each bent portion is surrounded by a non-active region. That is, according to the present embodiment, the bent portions of the gate fingers, at which the electric field tends to concentrate, are prevented from functioning as part of the gates of the FET, which reduces the electric field concentration at these bent portions and thereby prevents a reduction in the dielectric strength of the FET. It should be further noted that the laterally extending portions and the longitudinally extending portions of the recesses are formed to have substantially the same width (as described above), thereby avoiding degradation of the characteristics of the FET due to the difference in width between these portions.

Referring to FIG. 4, the active region of the n-type GaAs layer 31 between the gate fingers 34 and 35 continuously extends from the input ends of the gate electrodes to the terminal ends thereof, that is, the active region is not divided by the non-active regions. Therefore, an electrode pad may be provided on the n-type GaAs layer 31 and between the gate fingers 34 and 35, and a bias may be applied to the electrode pad to prevent the potential of the n-type GaAs layer 31 (or active region) from varying with position between the gate electrodes (or gate fingers).

In FIG. 4, a potential clamp electrode 48 is disposed on the n-type GaAs layer 31 and between the gate fingers 34 and 35 to clamp or fix the potential of the n-type GaAs layer 31. The potential clamp electrode 48 is formed of an ohmic metal and connected to the ohmic electrodes 32 through metal wiring 47 and metal resistances 33. Further, the metal resistances 33 have a high resistance of a few to a few tens of kilohms and are made of WSiN, etc.

According to the present embodiment as described above, a non-active region is formed around each bent portion of the gate electrodes to reduce the electric field concentration at the bent portion and thereby prevent a reduction in the dielectric strength of the FET. Further, since the active region of the semiconductor layer (or the n-type GaAs layer 31) between the gate electrodes continuously extends from the input ends of the gate electrodes to the terminal ends thereof, it is possible to prevent the potential of the semiconductor layer (or active region) from varying with position between the gate electrodes by applying a bias to the semiconductor layer.

Further, although the gate electrodes (or gate figures) of the present embodiment have a crank shape as shown in FIG. 4, the present invention is not limited to this particular gate shape. The present invention can be applied to any gate electrode having a bent portion(s).

Specifically, in FIG. 4, each gate electrode (or gate finger) extends along three sides of a rectangle. In this case, the four apexes of the rectangle correspond to the bent portions of the gate electrode. However, another crank-shaped double gate structure may be employed in which each gate electrode extends along two sides of a triangle. In this case, the three apexes of the triangle correspond to the bent portions of the gate electrode. Since the electric field tends to concentrate at these apexes, or bent portions, a non-active region may be formed around each of them to produce the beneficial effects as described above.

Further, although the field effect transistor of the present embodiment employs an n-type GaAs layer, other compound semiconductor layers may be used instead, such as n-type GaN layers.

Further, the present embodiment can also be applied to FETs having a crank-shaped multigate structure that has no recesses. That is, also in such structures, a non-active region may be formed around each bent portion of the crank-shaped gate electrodes to prevent or reduce the electric field concentration at the bent portion and thereby enhance the dielectric strength and reliability of the FET.

Fourth Embodiment

Figure 5:
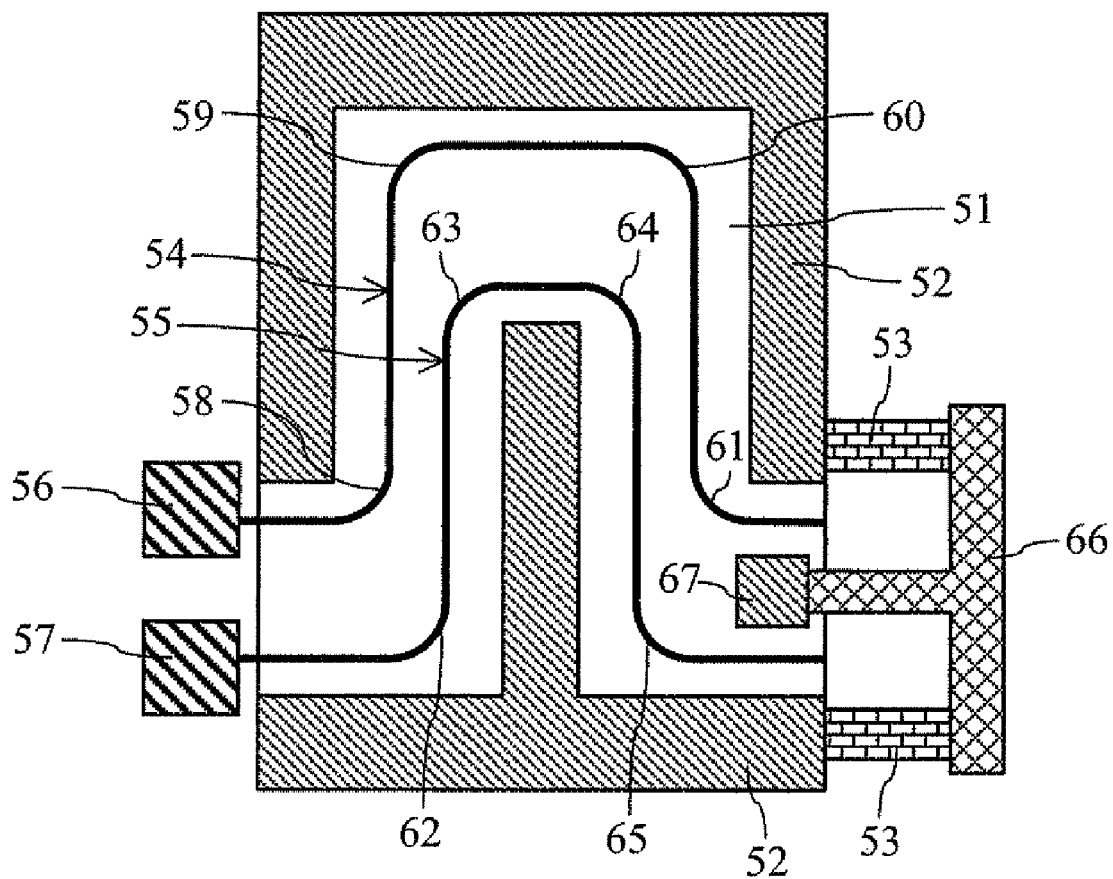
FIG. 5 is a plan view of a field effect transistor according to a fourth embodiment of the present invention.

FIG. 5 is a plan view of a field effect transistor according to a fourth embodiment of the present invention. Although the field effect transistor of the present embodiment has a crank-shaped double gate structure, the present invention is not limited to this particular type of field effect transistor. The present invention can be applied to any field effect transistor having a crank-shaped multigate structure.

Referring to FIG. 5, a pair of ohmic electrodes 52 is disposed on an n-type GaAs layer 51. One of the ohmic electrodes 52 is a source electrode, and the other ohmic electrode is a drain electrode. The n-type impurity in the n-type GaAs layer 51 may be Si (silicon).

Two recesses are formed in the surface of the n-type GaAs layer 51 and between the ohmic electrodes 52 (see FIGS. 2A and 2B). Further, gate fingers 54 and 55 are disposed within their respective recesses. That is, this field effect transistor has a double gate structure in which two parallel gate electrodes 54 and 55 are sandwiched between a pair of ohmic electrodes 52. Further, the gate fingers 54 and 55 have a crank shape, as shown in FIG. 5.

The recesses can be formed by wet etching in the same manner as described in connection with the first embodiment. The present embodiment assumes that the perpendicularly extending portions and the parallelly extending portions of the recesses relative to the [0, $\bar{1}$, $\bar{1}$] crystal orientation of the n-type GaAs layer 51 have substantially the same width (that is, in FIGS. 2A and 2B, $W_1$-$W_2$). It should be noted that in FIG. 5 the lateral direction corresponds to a perpendicular direction relative to the above crystal orientation of the n-type GaAs layer 51, and the longitudinal direction corresponds to a parallel direction.

Gate input terminals 56 and 57 are disposed outside the ohmic electrodes 52 and the n-type GaAs layer 51. The gate fingers 54 and 55 are connected to the gate input terminals 56 and 57, respectively. Gate signals are input to the gate fingers 54 and 55 through the gate input terminals 56 and 57, respectively.

The field effect transistor of the present embodiment is characterized in that bent portions 58 to 61 of the gate finger 54 and bent portions 62 to 65 of the gate finger 55 have an arc shape with a predetermined radius of curvature. In the case of conventional field effect transistors having a crank-shaped multigate structure, since the crank-shaped gate fingers are abruptly bent at a right angle, the electric field concentrates at such bent portions, which results in reduced dielectric strength. On the other hand, in the field effect transistor of the present embodiment, the bent portions of the crank-shaped gate fingers have an arc shape, which reduces the electric field concentration at these bent portions and thereby prevents a reduction in the dielectric strength of the field effect transistor.

It should be noted that the smaller the radius of curvature of the bent portions, the higher the electric field concentration at these portions. Therefore, the bent portions preferably have a large radius of curvature. However, this results in increased gate electrode area and hence increased chip size. This trade-off must be considered in determining the radius of curvature of the bent portions of the gate electrodes.

According to the present embodiment, the entire portions of the gate fingers are surrounded by the active region. Therefore, both the laterally extending portions and longitudinally extending portions of the gate fingers function as part of the gates of the FET and hence contribute to its operation. It should be further noted that the laterally extending portions and the longitudinally extending portions of the recesses are formed to have substantially the same width (as described above), thereby avoiding degradation of the characteristics of the FET due to the difference in width between these portions.

Referring to FIG. 5, the active region of the n-type GaAs layer 51 between the gate fingers 54 and 55 continuously extends from the input ends of the gate electrodes to the terminal ends thereof, that is, the active region is not divided by the non-active regions. Therefore, an electrode pad may be provided on the n-type GaAs layer 51 and between the gate fingers 54 and 55, and a bias may be applied to the electrode pad to prevent the potential of the n-type GaAs layer 51 (or active region) from varying with position between the gate electrodes (or gate fingers).

In FIG. 5, a potential clamp electrode 67 is disposed on the n-type GaAs layer 51 and between the gate fingers 54 and 55 to clamp or fix the potential of the n-type GaAs layer 51. The potential clamp electrode 67 is formed of an ohmic metal and connected to the ohmic electrodes 52 through metal wiring 66 and metal resistances 53. Further, metal resistances 53 have a high resistance of a few to a few tens of kilohms and are made of WSiN, etc.

According to the present embodiment as described above, the bent portions of the gate electrodes have an arc shape with a predetermined radius of curvature, which reduces the electric field concentration at these bent portions and thereby prevents a reduction in the dielectric strength of the FET. Further, since the active region of the semiconductor layer between the gate electrodes continuously extends from the input ends of the gate electrodes to the terminal ends thereof, it is possible to prevent the potential of the semiconductor layer (active region) from varying with position between the gate electrodes by applying a bias to the semiconductor layer.

Further, although the field effect transistor of the present embodiment employs an n-type GaAs layer, other compound semiconductor layers may be used instead, such as n-type GaN layers.

Further, the present embodiment can also be applied to FETs having a crank-shaped multigate structure that has no recesses. That is, also in such structures, the bent portions of the crank-shaped gate electrodes may be formed to have an arc shape with a predetermined curvature to prevent or reduce the electric field concentration at these bent portions and thereby enhance the dielectric strength and reliability of the FET.

It should be understood that the present invention is not limited to the embodiments described above, and various alterations may be made thereto without departing from the spirit and scope of the invention.

The entire disclosure of a Japanese Patent Application No. 2007-11945, filed on Jan. 22, 2007 including specification, claims, drawings and summary, on which the Convention priority of the present application is based, are incorporated herein by reference in its entirety.

The invention claimed is:

1. A field effect transistor having a crank-shaped multigate structure, comprising:
   a pair of ohmic electrodes;
   a semiconductor layer located between said pair of ohmic electrodes and having a recess that has a perpendicular-extending portion and a parallel-extending portion, relative to a crystal orientation of said semiconductor layer; and
   a plurality of crank-shaped gate electrodes located within said recess of said semiconductor layer, each gate electrode having a perpendicular-extending portion and a parallel-extending portion, relative to the crystal orientation of said semiconductor layer, said perpendicular-extending portion being disposed within said perpendicular-extending portion of said recess, said parallel-extending portion being disposed within said parallel-extending portion of said recess, wherein
      said semiconductor layer includes a non-active region located around either said perpendicular-extending portion or said parallel-extending portion of said plurality of gate electrodes relative to the crystal orientation of said semiconductor layer, and
      said semiconductor layer further includes an active region in a principal surface of said semiconductor layer, located between said plurality of gate electrodes, said active region continuously extending from input ends of said plurality of gate electrodes to terminal ends of said plurality of gate electrodes, and including a potential clamp electrode located on a surface of said active region.

2. The field effect transistor as claimed in claim 1, wherein said non-active region is located around the one of said perpendicular-extending portion and said parallel-extending portion of said plurality of gate electrodes having a smaller width than a corresponding recess.

3. The field effect transistor as claimed in claim 1, wherein:
   said plurality of gate electrodes includes a serially connected gate finger and wire of a different material from said gate finger;
   said gate finger is said gate electrode in said active region; and
   said wire is said gate electrode in said non-active region.

4. The field effect transistor as claimed in claim 1, wherein:
   said semiconductor layer is n-type GaAs; and
   the crystal orientation is a $[0, \bar{1}, \bar{1}]$ direction.

5. A field effect transistor having a crank-shaped multigate structure, comprising:
   a pair of ohmic electrodes;
   a semiconductor layer located between said pair of ohmic electrodes and including an active region and a non-active region; and
   a plurality of crank-shaped gate electrodes located on said semiconductor layer, each crank-shape gate electrode having a bent portion, wherein
      said active region of said semiconductor layer is disposed between said plurality of crank-shaped gate electrodes and continuously extends from input ends of said plurality of crank-shaped gate electrodes to terminal ends of said plurality of crank-shaped gate electrodes, and
      said non-active region of said semiconductor layer is located under said bent portion of said plurality of crank-shaped gate electrodes.

6. The field effect transistor as claimed in claim 5, wherein:
   said semiconductor layer has a recess; and
   said plurality of gate electrodes are located within said recess.

7. The field effect transistor as claimed in claim 5, including a plurality of said non-active regions, wherein each crank-shaped gate electrode has a plurality of substantially mutually transverse longitudinal and lateral portions, said longitudinal and lateral portions of each crank-shaped gate electrode being serially joined so that each crank-shaped gate electrode includes bent portions, and said non-active regions are located only under said bent portions of said plurality of crank-shaped gate electrodes.

* * * * *